United States Patent [19]

Shibuya et al.

[11] Patent Number: 5,470,398
[45] Date of Patent: Nov. 28, 1995

[54] DIELECTRIC THIN FILM AND METHOD OF MANUFACTURING SAME

[75] Inventors: Munehiro Shibuya, Katano; Masatoshi Kitagawa, Hirakata; Takeshi Kamada, Ikeda; Takashi Hirao, Moriguchi, all of Japan

[73] Assignee: Matsushita Electric Industrial Co., Ltd., Osaka, Japan

[21] Appl. No.: 763,674

[22] Filed: Sep. 23, 1991

[30]    Foreign Application Priority Data

Sep. 25, 1990 [JP] Japan .................. 2-255791

[51] Int. Cl.⁶ .................................. H01L 21/312
[52] U.S. Cl. .................................. 148/33.3; 252/62.3 BT; 437/235; 437/236
[58] Field of Search ............ 252/62.3 BT; 148/33.3; 437/235, 236

[56]         References Cited

U.S. PATENT DOCUMENTS 4,310,567   1/1982   Tabata et al. ..................... 437/235

4,486,096   12/1984  Endo et al. ....................... 356/225
4,665,608   5/1987   Okamoto et al. .................. 29/571
4,731,560   3/1988   Ernsthausen ...................... 313/587

OTHER PUBLICATIONS

S. Wolf and R. N. Tauber, "Oxidation of Silicides", *Silicon Processing for the VLSI Era, vol. 1–Process Technology*, at pp. 395–397 (1986).

*Primary Examiner*—Robert Kunemund
*Attorney, Agent, or Firm*—Ratner & Prestia

[57]            ABSTRACT

A dielectric film is provided which may be used as an insulating layer of a capacitor of a semiconductor DRAM. The dielectric film is comprised of three elements, namely, titanium, silicon and oxygen. The dielectric film has a high dielectric constant and a small leakage current. The film is manufactured from the raw materials of titanium chloride and silicon hydride, and at least one of $O_2$, $N_2O$, and a mixture of $O_2$ and $N_2O$ by plasma-decomposing the raw materials with the application of a strong electric field.

5 Claims, 2 Drawing Sheets 5,470,398

DIELECTRIC THIN FILM AND METHOD OF MANUFACTURING SAME

BACKGROUND OF THE INVENTION

This invention relates to a dielectric thin film of silicon and titanium oxide used as an insulating layer for a capacitor in a semiconductor DRAM. A method of manufacturing such a dielectric thin film is also disclosed.

In the past, as the insulating layer of a DRAM capacitor, a film of either $SiO_2$ or $Si_3N_4$ has been used. These films have small leakage current, high breakdown voltage, and high reliability. However, with a dielectric constant of only 5, these films do not obtain enough capacitance for DRAMs of more than 64M bit having a small area for the capacitor. Thus, instead of using $SiO_2$ and $Si_3N_4$ as the material for the insulating layer of the capacitor, $Ta_2O_5$, with a dielectric constant 5 to 6 times larger than that of $SiO_2$, has been noted, and its application has been investigated. However, $Ta_2O_5$ thin film has the disadvantage that its leakage current is large compared with an $SiO_2$ layer. $Ta_2O_5$ thin film also has the disadvantage of the dielectric constant sharply decreasing in the vicinity of 100 Å thickness, which is typical as the insulating layer in the actual DRAM. The dielectric constant of $TiO_2$ goes down as a $TiO_2$ thin film becomes thinner. However, this does not matter, due to the high dielectric constant of $TiO_2$ (being about 100) in the bulk state. Thus, the film can be used as an insulating layer of the capacitor. Nevertheless, $TiO_2$ film has the disadvantage of a large leakage current. Thus, in the application of a DRAM of more than 64M bits, the $SiO_2$ layer or $Si_3N_4$ layer does not have enough capacitance due to the small dielectric constant, despite the small leakage current and high reliability. Also, the $TiO_2$ film has a large dielectric constant and can obtain sufficient capacitance, but, still, is of low reliability on account of its large leakage current. Accordingly, the films comprised of $SiO_2$, $Si_3N_4$ and $TiO_2$ are not practical for the insulation layer of the capacitor of the high-density DRAM.

SUMMARY OF THE INVENTION

An object of the present invention is to provide a novel film of dielectrics, applicable as the insulator of a capacitor of a DRAM, with a small leakage current and a high dielectric constant. A method of manufacturing such a dielectric film is also provided.

In order to attain the above-described object, the dielectric film, according to the present invention, comprises at least titanium, silicon and oxygen. In this manner, a new film having the advantages of $SiO_2$ and $TiO_2$ is realized, namely, with a small leakage current and a high dielectric constant.

For manufacturing the above dielectric film, further according to the present invention, mixed gases of titanium chloride, silicon hydride such as monosilane, and either $O_2$, $N_2O$ or a mixture of $O_2$ and $N_2O$ are introduced into a vacuum chamber. By the application of the external energy, e.g. electric voltage, these gases are plasma-decomposed, to deposit the silicon titanium oxide films on a substrate of silicon, poly-silicon, quartz, or tungsten silicide (WSi).

By forming a dielectric thin film comprising Si, Ti, and O as its main constituents, a thin film having the characteristics of both $SiO_2$ and $TiO_2$ is obtained. That is, by adjusting the composition of Ti, Si, and O, and the temperature, energy, and pressure, a dielectric thin film with a small leakage current and a high dielectric constant is formed. With the use of titanium chloride and silicon hydride as the raw materials, the chlorine reacts with the hydrogen, and the chlorine and hydrogen are prevented from being introduced into the film.

DETAILED DESCRIPTION OF THE INVENTION

Figure 1:
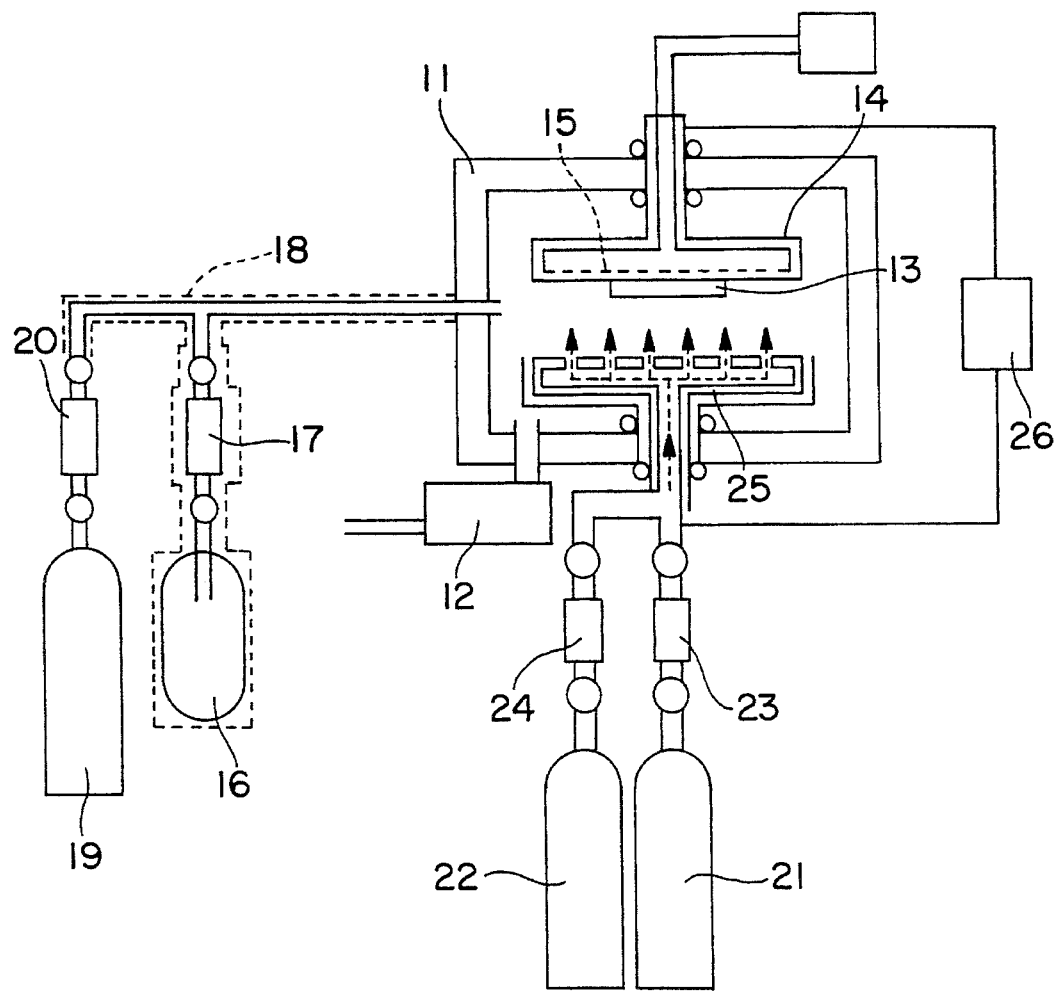
FIG. 1 is a schematic diagram of a plasma chemical vapor deposition (CVD) apparatus to be used for the manufacturing of a dielectric thin film according to the present invention.

Now, referring to FIG. 1 and FIG. 2, an embodiment of the present invention will be explained as follows. FIG. 1 shows a general construction of an apparatus used for the manufacturing of the dielectric thin film according to the invention. A vacuum chamber 11 is exhausted by a vacuum pump 12. A substrate 13 of silicon, poly-silicon, quartz, or tungsten silicide, is fixed on a substrate holder 14, and is heated to 200° C.–600° C. by a substrate heater 15. The titanium chloride in an ampoule 16 is introduced into the vacuum chamber 11, with the flow rate of 0–40 Standard Cubic Centimeter per Minutes (SCCM) under the control of a flow controller 17. At this time, the titanium chloride and the flow controller 17 are heated to 70° C. by a heater 18. The carrier gas of nitrogen in the cylinder 19 is also introduced into the vacuum chamber 11 under the control of the flow controller 20. The $N_2O$ gas in the cylinder 21, and monosilane gas in a cylinder 22 are introduced into the chamber 11 at a rate of 50–500 and 0–10 SCCM under the control of a controller 23 and 24 respectively. The gases thus introduced are exposed to a strong electric field by an electric power source 26, and a plasma is generated between the substrate holder 14 and the lower electrode 25, thus depositing a thin layer of an oxide of titanium and silicon upon the substrate 13.

Figure 2:
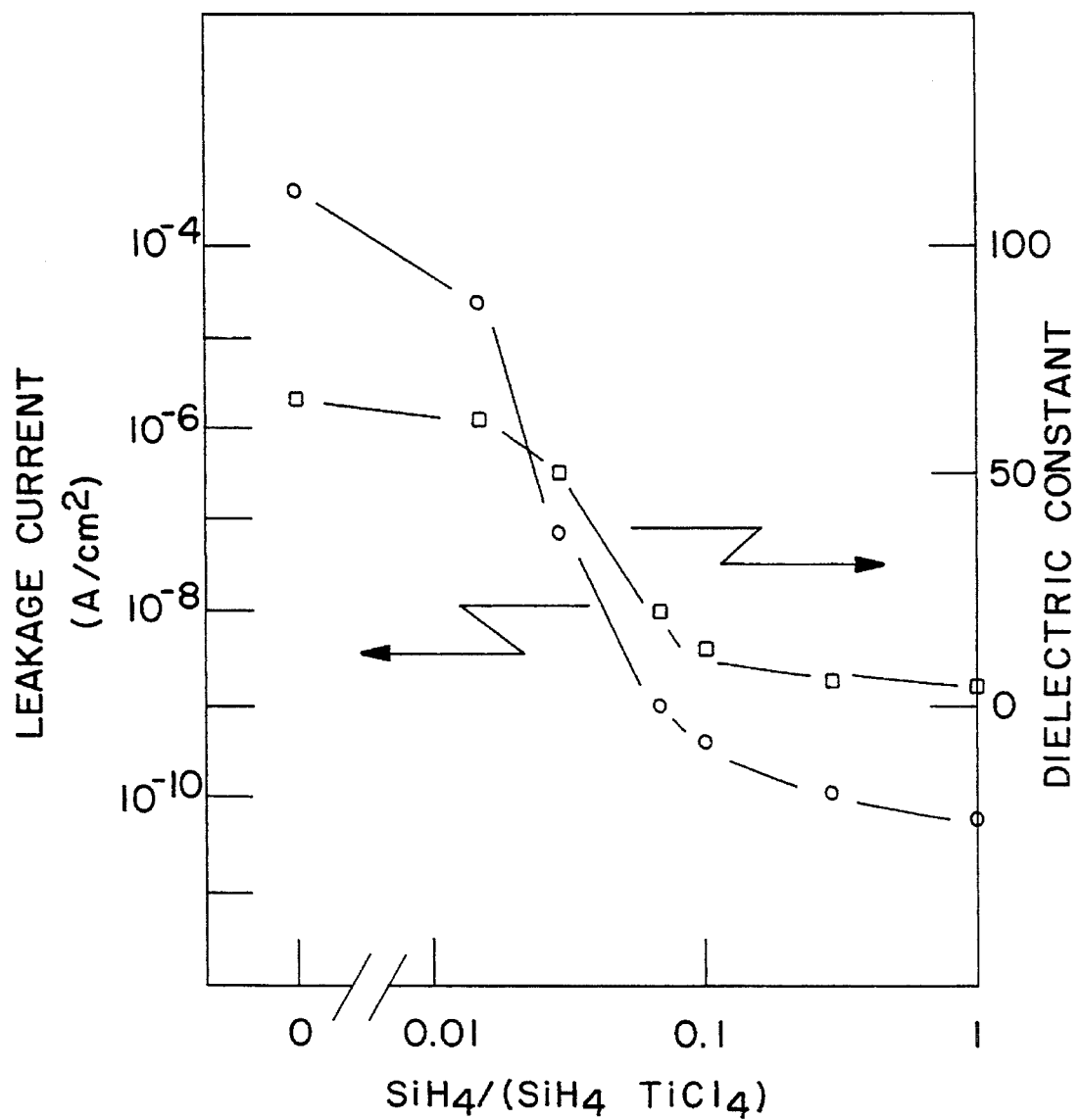
FIG. 2 is a graph showing the variation of dielectric constant and leakage current density of the dielectric film against the variation of the flow rate of the raw material monosilane and titanium chloride.

FIG. 2 shows a variation of the dielectric constant and leakage current against a variation of the ratio of titanium chloride and monosilane gases ($SiH_4/(SiH_4+TiCl_4)$), with 40 SCCM total flow of the titanium chloride and monosilane gas and 100 SCCM $N_2O$ gas, while the pressure, electric power density, and substrate temperature are maintained at a constant 0.4 Torr, 140 mW and 300° C. respectively. For the flow of 40 SCCM titanium chloride and 0 SCCM monosilane, the dielectric constant is as high as 63, whereas the leakage current is $10^{-4}$ A/cm$^2$. As the flow of the titanium chloride is reduced and the flow of monosilane is increased, the dielectric constant and the leakage current decreases. For a 3 SCCM flow of $SiH_4$ and a 37 SCCM flow of $TiCl_4$, the dielectric constant is about 20, and the leakage current is $10^{-9}$ A/cm$^2$ so that the layer can be used as an insulator for a capacitor in a DRAM.

Thus, the dielectric constant and leakage current can be easily controlled by adjusting the flow of the titanium chloride and monosilane. By increasing the flow of the titanium chloride to obtain a high dielectric constant, and increasing the flow of monosilane to obtain a small leakage current, the desired dielectric layer can be obtained. Further, by adjusting the pressure, substrate temperature, and radio frequency power, a thin layer with a small leakage current comparable to $SiO_2$ and $Si_3N_4$ and a high dielectric constant can be deposited. Also, since the titanium chloride and silicon hydride gases are used as the raw material, the chloride reacts with the hydrogen and the penetration of the chlorine and hydrogen into the film is prevented.

What is claimed:

1. A single dielectric film comprising oxides of titanium and silicon, said film having a high dielectric constant and a low leakage current resulting from a single step deposition by exposing a substrate to a plasma generated by simultaneously flowing titanium chloride, nitrogen, nitrous oxide and a monosilane into a vacuum chamber containing the substrate and means for creating said plasma.

2. A dielectric film comprising oxides of silicon and titanium said film deposited in a single step on a substrate by plasma chemical vapor deposition using titanium chloride and monosilane as reactants and nitrogen and nitrous oxide as carrier gases.

3. A dielectric film deposited in a single step used as an insulating film of a capacitor in a semiconductor dynamic random access memory, said dielectric film comprises oxides of titanium and silicon with a dielectric constant about 20 and a leakage current about $10^{-9}$ A/cm$^2$.

4. A dielectric film of claim 3, wherein said dielectric film comprises oxides of silicon and titanium formed by plasma chemical vapor deposition using monosilane and titanium chloride simultaneously as reactants in a vacuum at least 0.4 torr.

5. A dielectric film of claim 1, wherein said dielectric constant is substantially similar to that of an SiO$_2$ film and said leakage current is substantially similar to that of a TiO$_2$ film.

* * * * *